(12) United States Patent
Atallah et al.

(10) Patent No.: US 6,593,789 B2
(45) Date of Patent: Jul. 15, 2003

(54) PRECISE AND PROGRAMMABLE DUTY CYCLE GENERATOR

(75) Inventors: Francois I. Atallah, Raleigh, NC (US); Anthony Correale, Jr., Raleigh, NC (US); David J. Seman, Apex, NC (US); Richard D. Tax, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/020,528

(22) Filed: Dec. 14, 2001

(65) Prior Publication Data

US 2003/0112046 A1 Jun. 19, 2003

(51) Int. Cl.[7] ............................................... H03K 3/017
(52) U.S. Cl. ..................................................... 327/175
(58) Field of Search ................................. 327/170, 172, 327/175, 176, 276–278, 281, 284, 285, 288, 291–293

(56) References Cited

U.S. PATENT DOCUMENTS

| | | | | |
|---|---|---|---|---|
| 3,963,992 A | * | 6/1976 | Hekimian et al. | 327/332 |
| 4,414,637 A | | 11/1983 | Stanley | 364/569 |
| 4,482,826 A | | 11/1984 | Ems et al. | 327/276 |
| 4,881,041 A | | 11/1989 | Kawanabe et al. | 327/167 |
| 5,157,277 A | | 10/1992 | Tran et al. | 327/156 |
| 5,220,216 A | * | 6/1993 | Woo | 326/50 |
| 5,231,320 A | | 7/1993 | Kase | 327/277 |
| 5,302,920 A | | 4/1994 | Bitting | 331/45 |
| 5,349,311 A | | 9/1994 | Mentzer | 331/57 |
| 5,394,114 A | | 2/1995 | Davis | 331/1 A |
| 5,406,590 A | | 4/1995 | Miller et al. | 375/376 |
| 5,451,893 A | | 9/1995 | Anderson | 327/174 |
| 5,563,605 A | | 10/1996 | McEwan | 342/202 |
| 5,903,747 A | | 5/1999 | Casal | 395/556 |
| 5,923,200 A | | 7/1999 | Shimizume | 327/277 |
| 5,933,039 A | | 8/1999 | Hui et al. | 327/262 |
| 5,949,292 A | | 9/1999 | Fahrenbruch et al. | 331/57 |
| 6,028,491 A | | 2/2000 | Stanchak et al. | 331/75 |
| 6,163,195 A | * | 12/2000 | Jefferson | 327/261 |
| 6,166,821 A | * | 12/2000 | Blumer | 347/112 |
| 6,243,784 B1 | * | 6/2001 | Anderson et al. | 331/57 |
| 6,437,621 B2 | * | 8/2002 | Kato et al. | 327/175 |
| 6,441,600 B1 | * | 8/2002 | Atallah et al. | 327/175 |

* cited by examiner

Primary Examiner—My-Trang Nu Ton
(74) Attorney, Agent, or Firm—Scott W. Reid; Scully, Scott, Murphy & Presser, P.C.

(57) ABSTRACT

A precise and programmable duty cycle generator which can produce a user definable duty cycle clock signal with precision. This circuit is comprised of a number of generally known circuit elements such as a digital to analog converter (DAC), low pass filter (LPF) and operational transconductance amplifier (OTA), as well as a unique voltage controlled duty cycle generator (VCDCG). The circuit has the ability to produce a user programmable duty cycle clock signal with precision over a broad range of operational frequencies. The VCDCG circuit is unique and employs a number of stages, each of which has a current starved inverter which is immediately followed by a conventional inverter to allow duty cycle corrections to be either additive or subtractive. The current starved inverters are controlled by a single voltage, which causes the current starved inverter's delay to degrade/improve on only one transition to effect a change in the duty cycle. For improved precision, a differential embodiment employs the same VCDCG.

16 Claims, 6 Drawing Sheets

Block Diagram of Single-Ended Programmable Duty Cycle Correction Circuit

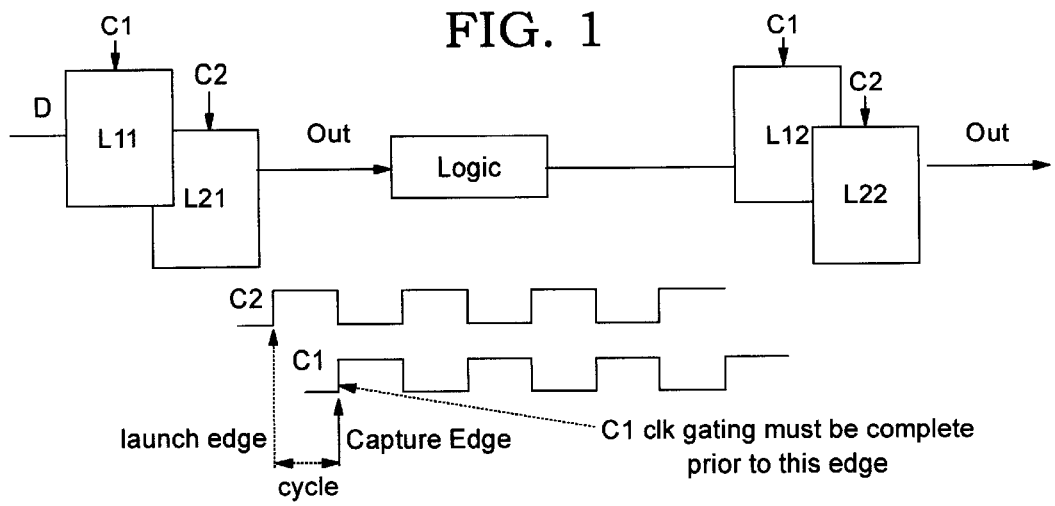
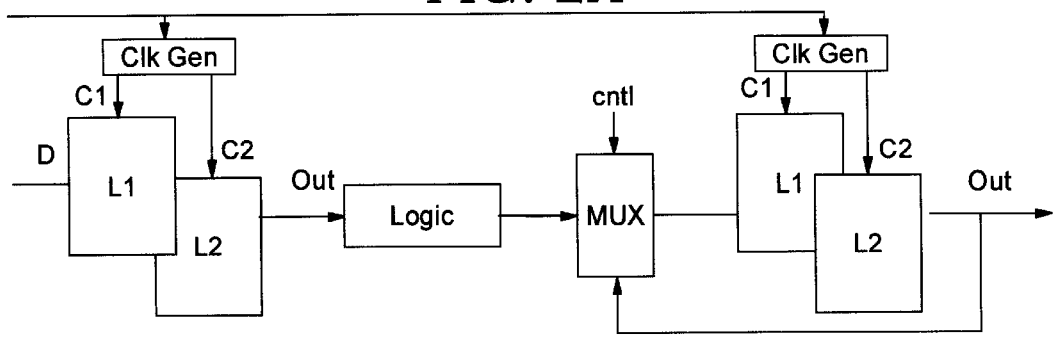
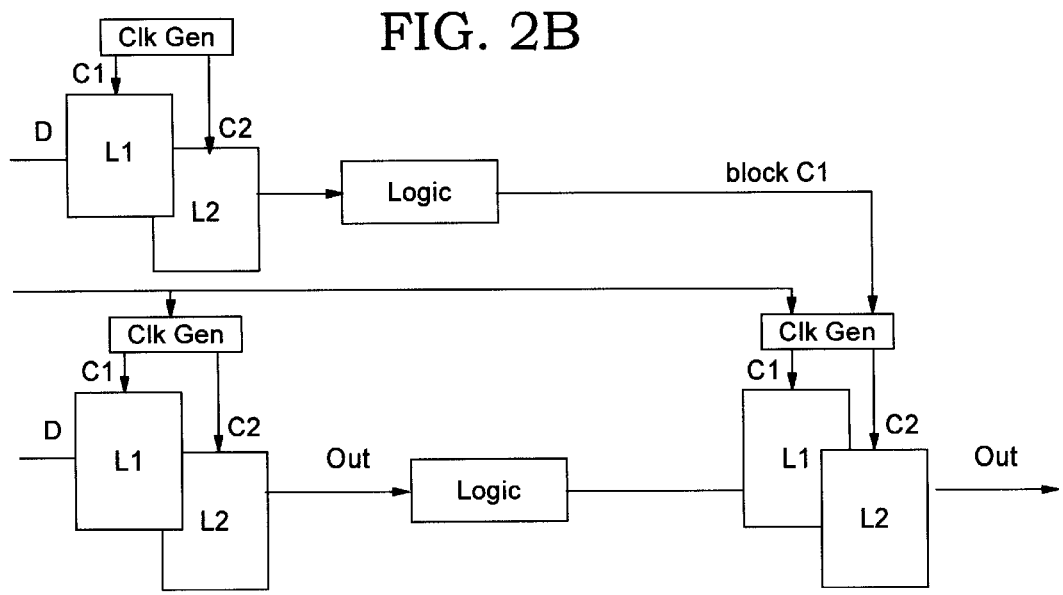

Block Diagram of Single-Ended Programmable Duty Cycle Correction Circuit

PRECISE AND PROGRAMMABLE DUTY CYCLE GENERATOR

BACKGROUND OF THE INVENTION

1. Field of the Invention

The present invention relates generally to a precise and programmable duty cycle generator, and more particularly pertains to a precise and programmable duty cycle generator which provides a programmable duty cycle clock from an input clock signal having any duty cycle.

Almost all ICs require a clock signal to accomplish their operations and be synchronous with other related components. The frequency of this clock determines the performance of the IC. As sub-micron technologies allow designs to operate at higher frequencies, design techniques must also provide for increasing their performance. An adjustable duty cycle clock circuit provides designers with flexibility in their designs, allowing them to meet high-performance and low-power goals. In addition to this flexibility, a programmable duty cycle adjuster provides robustness to the design. After fabrication, if the process was not modeled accurately, the duty cycle can be adjusted through the IC bus, fuses, or primary pins on the IC to operate the IC at the highest possible clock rate.

The present invention provides a circuit which provides a programmable duty cycle clock from an input clock signal having any duty cycle.

2. Discussion of the Prior Art

The idea of providing a circuit for duty cycle correction isn't new. The prior art has circuits which correct an incoming signal's duty cycle to a fixed value, typically 50—50.

The present invention differs from the prior art by allowing the output corrected signal to be programmable to any value duty cycle with precision.

U.S. Pat. No. 4,881,041 discloses a circuit to correct an incoming signal's duty cycle to a 50/50 duty cycle and is limited to a 50/50 duty cycle correction with no provision for any other duty cycle, and the circuit is completely different from the present invention. U.S. Pat. No. 5,157,277 discloses a circuit to convert a sine wave input clock signal at a 50/50 duty cycle into a square wave signal with a variable duty cycle. The conversion circuit is limited to sine wave inputs, and is significantly different from the present invention which addresses square wave signals.

SUMMARY OF THE INVENTION

Accordingly, it is a primary object of the present invention to provide a precise and programmable duty cycle generator which can produce a user definable duty cycle clock signal with precision. This circuit is comprised of a number of generally known circuit elements such as a digital to analog converter (DAC), low pass filter (LPF), and operational transconductance amplifier (OTA), as well as a unique voltage controlled duty cycle generator (VCDCG). The circuit has the ability to produce a user programmable duty cycle clock signal with precision over a broad range of operational frequencies. The VCDCG circuit is unique and employs a number of stages, each of which has a current starved inverter which is immediately followed by a conventional inverter to allow duty cycle corrections to be either additive or subtractive. The current starved inverters are controlled by a single voltage, Vcont, and the series inverter isn't voltage controlled at all. The single control voltage causes the current starved inverter's delay to degrade/improve on one transition while improve/degrade on the other transition. For improved precision, a differential embodiment employs the same VCDCG.

A further object of the subject invention is the provision of an adjustable duty cycle clock circuit which provides designers with flexibility in their designs, allowing them to meet high-performance and low-power goals. In addition to this flexibility, a programmable duty cycle adjuster provides robustness to the design. After fabrication, if the process was not modeled accurately, the duty cycle can be adjusted through the IC bus, fuses, or primary pins on the IC to operate the IC at the highest possible clock rate.

BRIEF DESCRIPTION OF THE DRAWINGS

The foregoing objects and advantages of the present invention for a precise and programmable duty cycle generator may be more readily understood by one skilled in the art with reference being had to the following detailed description of several embodiments thereof, taken in conjunction with the accompanying drawings wherein like elements are designated by identical reference numerals throughout the several views, and in which:

FIG. 1 illustrates a basic clock launch and capture schematic and shows typical clock signals having a C1 clock phase and a C2 clock phase, and the propagation of clock signal phases C1, C2 through latches L11, L21, Logic and latches L12, L22.

FIG. 2A illustrates the use of a multiplexor to hold the prior state of the L1 latch in the absence of a block C1 gating signal, and FIG. 2B shows the use of a block C1 generate signal in the clock generator.

DETAILED DESCRIPTION OF THE INVENTION

Figure 3:
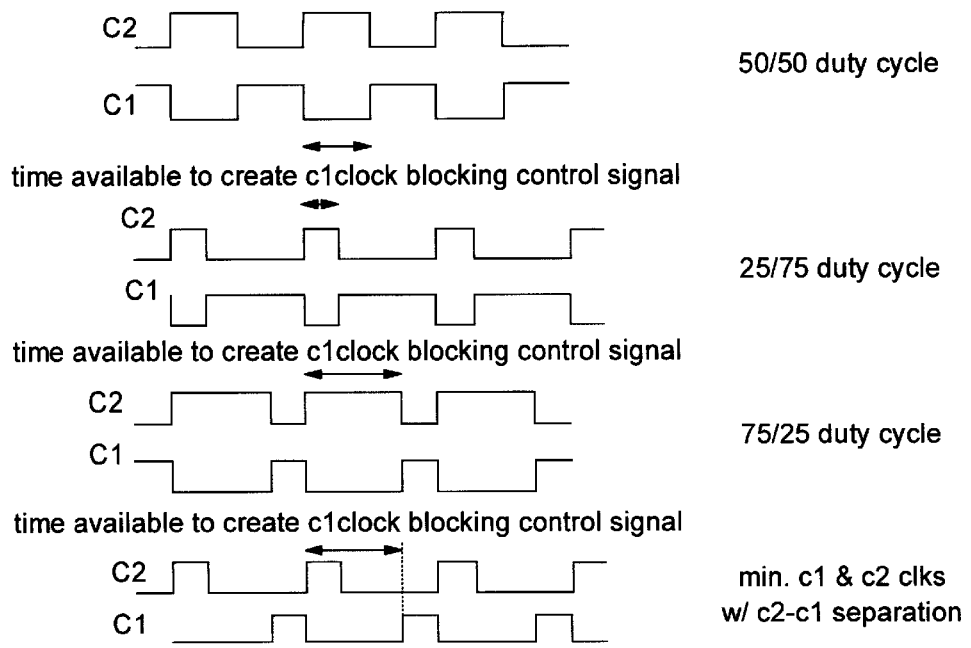
FIG. 3 illustrates the available time to generate the C1 clock blocking signal as a function of duty cycle and minimum pulse width C1–C2 separation.

In a multi-phase clocking network, not only is the clock frequency important, but the duty cycle of the clocks can also affect performance and power dissipation. Typically, the first phase of the clock (C1) is used to capture data and the second phase (C2) is used to launch data. The launch is typically associated with the rising edge of the C2 clock, with the capture being completed by the falling edge of the C1 clock for a polarity hold master-slave latch configuration. The pulse width of the C1 clock is generally associated with the down time of the C2 clock. The ability to elongate the C2 pulse width (duty cycle) allows for a shorter C1 clock pulse. This in turn can provide more time for the creation of a C1 clock blocking/gating signal to reduce clock and system power dissipation. The power reduction comes in the form of eliminating the capture clock from being generated, and reducing the otherwise aggressive performance of the circuits to meet the shortened time for blocking/gating generation.

FIG. 1 illustrates the basic clock launch and capture schematic and shows typical clock signals having a C1 clock phase and a C2 clock phase, and the propagation of clock signal phases C1, C2 through latches L11, L21, Logic and latches L12, L22 (wherein latches L11 and L12 are referred to generically hereinbelow as L1 latches and latches L21 and L22 are referred to generically hereinbelow as L2 latches). In FIG. 1, data held in the L11 latch is transferred to the L21 latch and the subsequent downstream logic on the rising edge of the C2 clock. The data propagates through all the downstream logic and ultimately arrives at the input of the L12 latch. The data is captured on the falling edge of the C1 clock. If the C1 clock is active having a wide pulse width during this data propagation phase, the L12 latch may toggle needlessly multiple times until the incoming data has been resolved. This results in wasted power. Hence, having a narrow C1 clock pulse width can save power by eliminating needless transitions within the L12 latch. Since the setup time of the L1 latch is a function of the pulse width of the C1 clock, too narrow a C1 pulse width can lengthen this critical performance metric. Hence, a careful choice must be made in selecting the C1 clock pulse width.

Another power attribute, as it pertains to C1 clock pulse width, is the time available for a gating signal to be generated to block the generation of the C1 clock for another latch or register. In this case, data is launched from an L2 latch on the rise of the C2 clock and must propagate through the control logic and arrive at the clock generator prior to the edge of the oscillator that will be used to generate the C1 clock. Allowing the C1 clock to be blocked, that is not generated, results in a power saving in the clock circuit that would have generated the non-needed clock and also eliminates the need for a feedback multiplexor to hold the prior state. FIG. 2A illustrates the use of a multiplexor to hold the prior state of the L1 latch in the absence of a block C1 gating signal and FIG. 2B shows the use of a block C1 generate signal in the clock generator.

The performance critical aspect of the C1 Clock gating signal's arrival can be reduced if the duty cycle of the system clock is such that the time when the C1 clock generator would go active could be delayed. This time can be thought of as either the C2 clock's pulse width for a non-overlapping clock arrangement or the sum of the C2 clock pulse width plus the separation between C2 falling and C1 rising edges. FIG. 3 illustrates this timing. The above points to the need to have a variable duty cycle generated system clock.

FIG. 3 illustrates that the available time to generate the C1 clock blocking signal is the same for the cases of 75/25 duty cycle and minimum pulse width C1 and C2 clocks with C1–C2 separation. Hence, a duty cycle correction system can improve the available time to generate or create a C1 clock blocking control signal either by varying the duty cycle or by generating minimum clock pulses with separation between pulses. As stated earlier, the use of minimum pulse widths often comes at a cost of a worse setup time. Since the system's performance is adversely affected by an elongated setup time, a means to reduce power without system degradation is also desired.

Since not all paths require C1 clock gating, those not needing it can have wider C1 pulses and improved data setup time. For those requiring a gated C1 clock, a tradeoff between more available time for the generation/creation of the blocking control signal and data setup time is desired and can be achieved by having unique duty cycle management. Also, since setup is a function of the stability of the power supply, noise generated by the falling edges of the C2 clock pulse in close time proximity with the narrow C1 pulse will adversely degrade the setup time. By employing a "waterfall" effect wherein the various C2 clocks fall at different times, the simultaneous switching noise will be reduced and hence will improve the setup time. This "waterfall" transitioning can be controlled by means of this programmable duty cycle correction scheme.

Also, not all sections of the chip have the same pulse width/duty cycle requirements. Normally the least common denominator approach prevails. This often results in sub-level optimization. By employing multiple concurrent duty cycle correction, each section can have its own optimized duty cycle.

Hence, we have established the need for a precise and programmable duty cycle correction/generation circuit.

High Level Overview

A programmable duty cycle generator circuit is comprised of:

(i) a set of register bits holding the digitally encoded duty cycle data;

(ii) an n-bit Digital-to-Analog Converter (DAC) used to convert the digitally encoded desired duty cycle into an analog voltage;

(iii) an Operational Transconductance Amplifier (OTA) used to compare the analog voltage representing the desired duty cycle with an analog feedback voltage;

(iv) a Voltage Controlled Duty Cycle Generator (VCDCG) which generates the desired duty cycle; and (v) a Low Pass Filter (LPF) which generates an analog voltage which is the feedback signal fed to the OTA thereby providing the closed loop operation.

Figure 4:
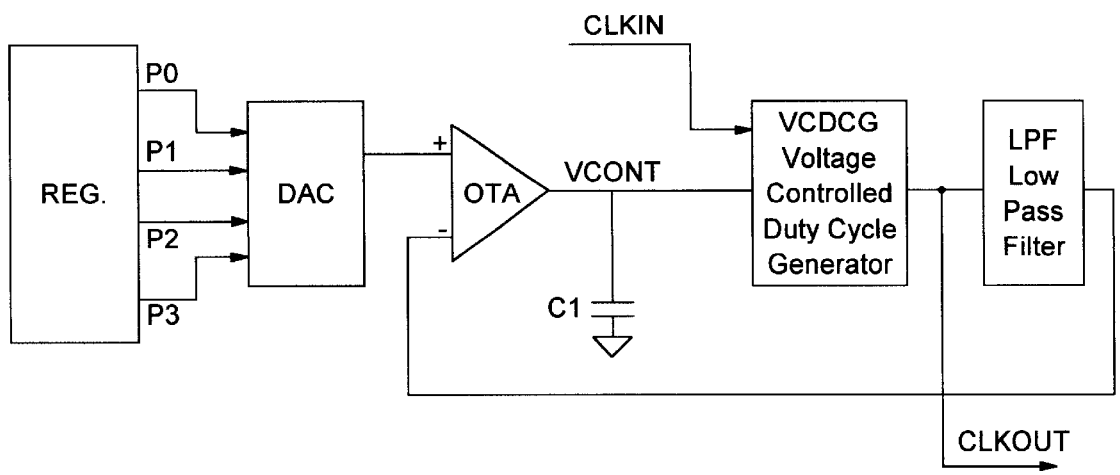
FIG. 4 is a block diagram of a single-ended programmable duty cycle generator circuit.

The inputs to the VCDCG are the input clock signal and the output of the OTA. The output of the VCDCG is the duty cycle corrected clock. FIG. 4 illustrates this basic configuration in a block diagram of a single-ended programmable duty cycle generator circuit. The Programmable Duty Cycle Correction circuit of FIG. 4 represents a single-ended implementation. A differential implementation which has higher noise immunity can be employed using the teachings of this disclosure and known differential techniques. Such a differential implementation is discussed in more detail later in this specification.

The Low Pass Filter (LPF) is the duty cycle measuring circuit whose output voltage is subtracted in the Operational Transconductance Amplifier (OTA) from a reference voltage generated from the DAC whose inputs, P0 through P3, set the equivalent DC voltage associated with the duty cycle desired. In this illustration, four inputs, P0–P3, define the encoded desired duty cycle. The OTA (Operational Transconductance Amplifier) will generate a current that is proportional to the difference of its input voltages. If the two voltages are equal, then no current will charge or discharge the capacitor C1 leading to a DC voltage at VCONT that forces the waveform at CLKOUT to be equal to the desired duty cycle. On the other hand, if the duty cycle at CLKOUT is less than the desired duty cycle, then the output of the Low Pass Filter will be smaller than the output of the DAC. The OTA will generate a current proportional to the difference between the output of the DAC and the output of the Low Pass Filter. The current will charge the capacitor causing VCONT to rise and the duty cycle at CLKOUT to increase. The mechanism is the same but in the other direction if the duty cycle of CLKOUT is greater than the desired duty cycle. Note that the Voltage Controlled Duty Cycle Generator (VCDCG) inverts CLKIN. If a non-inverting signal is desired, the output of the DAC and the output of the Low Pass Filter should be swapped going into the OTA.

FIG. 4 illustrates a generic embodiment of a programmable duty cycle generator. The register and the DAC provide the programmable function to the duty cycle generator, and function to generate a programmable DC voltage representative of the desired duty cycle. A nonprogrammable embodiment of a duty cycle generator might substitute a fixed DC voltage input to the OTA.

OTA

The operational transconductance amplifier provides a current that is proportional to the voltage difference between the desired DAC voltage and the measured voltage at the output of the filter. This circuit is well understood in the art and as such no further elaboration is needed.

DAC

Digital-to-Analog Converter (DAC) circuits are well understood and for this application a very simple DAC can be employed.

Figure 5:
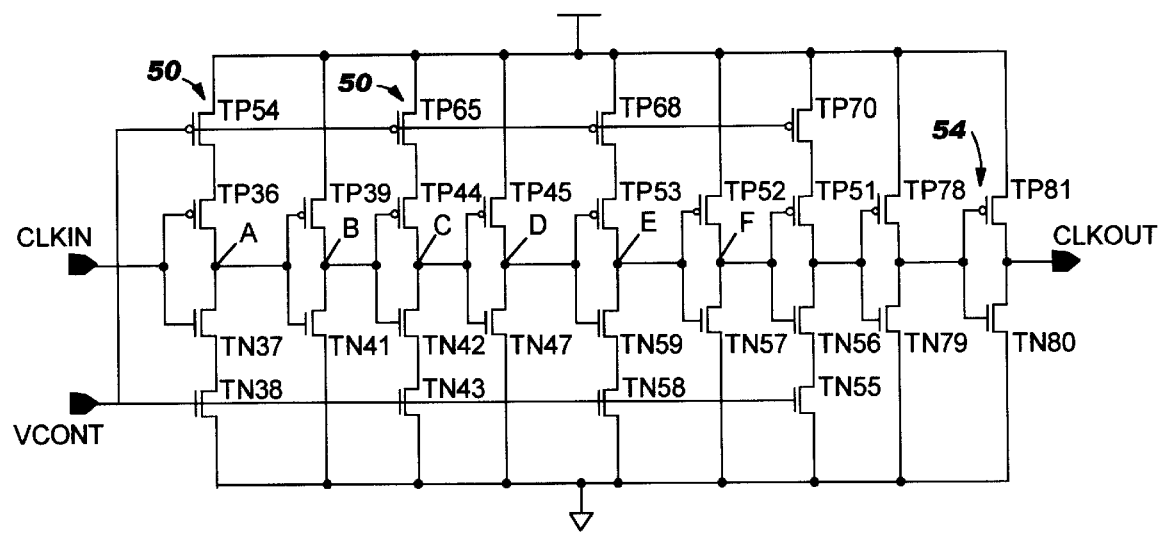
FIG. 5 illustrates a Voltage Controlled Duty Cycle Generator (VCDCG) which is a very important aspect of the present invention.

FIG. 5 illustrates a Voltage Controlled Duty Cycle Generator (VCDCG) which is a very important aspect of the present invention.

The Voltage Controlled Duty Cycle Generator is comprised of a plurality of current starved inverters 50, each of which comprises 2 PFETs: The top PFET (e.g. TP54 in stage 1) serves as a current source while the second PFET (e.g. TP36 in stage 1) in series serves as a switch, and 2 NFETs: The bottom NFET (e.g. TN38 in stage 1) serves as a current source while the second NFET (e.g. TN37 in stage 1) in series serves as a switch. These are followed by a series inverter 52 which presents a capacitive load to the current sources, to provide either additive or subtractive duty cycle corrections. The plurality of current starved inverters are controlled by the output control signal voltage VCONT of the operational amplifier which is connected to both the PFET current sources and the NFET current sources. The multiple stages of 50-52 are followed by a final conventional inverter 54 to provide a desired polarity clock pulse. The conventional inverter 54 can be omitted to provide opposite polarity clock pulses.

Unlike a conventional current starved inverter, the VCONT signal is connected to both the PFET current sources (TP64, TP66, TP68, or TP70) as well as the NFET current sources (TN38, TN43, TN58, or TN55). As the voltage at VCONT increases, the PFET current source will provide a smaller current to charge the capacitive load of the series inverter 52, and the NFET current source will provide a larger current to discharge the capacitive load of the series inverter 52. Therefore, at the output of each current starved inverter 50 the waveform has a slow rising edge and a fast falling edge. Because of the difference in edge rates, the output of each CMOS inverter 52 will have a longer falling delay (tphl) than the rising delay (tplh). This difference in delays produces a duty cycle correction that is controlled by VCONT. This mode of operation is reversed when the voltage at VCONT decreases.

Figure 6:
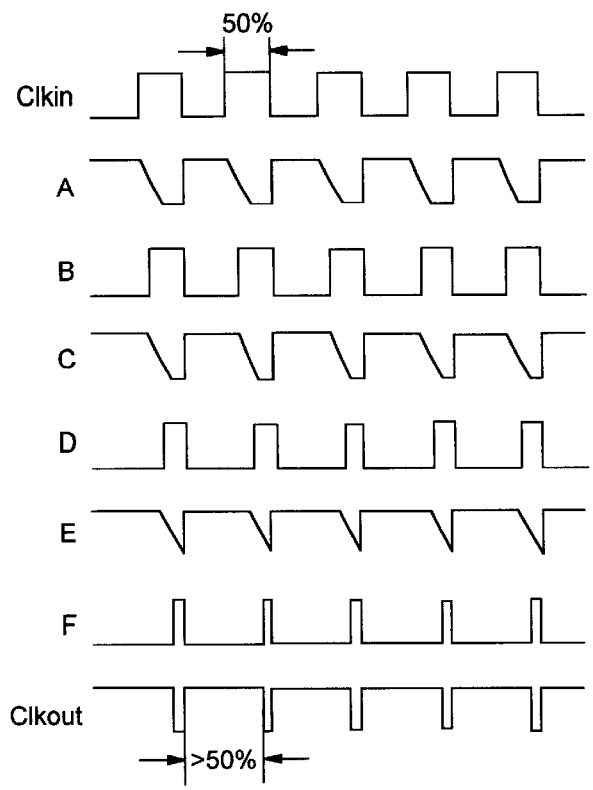
FIG. 6 illustrates a timing diagram for a 3-stage VCDCG for the case where a longer uptime is desired.

FIG. 6 illustrates a timing diagram for a 3-stage VCDCG for the case where a longer uptime is desired, wherein the waveforms A–F correspond to the nodes A-F of FIG. 5. As can be seen, the falling transitions associated with the output stages of the current starved inverters (nodes A, C and E) is 'slow' and rising transitions are crisp. The inverters following the current starved inverters invert the signals and provide crisp edges. Note however, that the pulse widths have been reduced and continue to be reduced as the signals propagate down the line. The final inverter 54 in the VCDCG reshapes the signal with crisp edges and supports the needed output drive, polarity and phase.

Note that while this VCDCG circuit may appear similar to a voltage controlled delay line (VCDL), it is quite a bit different. Typically in a VCDL all the elements are current starved inverters with the possible exception of the output driving section. The goal in a VCDL is to control delay, not duty cycle. In fact, the duty cycle within a VCDL is kept relatively constant There are generally two voltage controls used within the VCDL; one for the PFETS, VCONTP, and another for the nfets, VCONTN. To increase delay, the VCONTP is increased towards the power supply level whereas the VCONTN is decreased towards ground. In essence, the applied control voltages are moving in opposite directions. In contrast, the VCDCG employs a current starved inverter which is immediately followed by a conventional inverter to allow duty cycle corrections to be either additive or subtractive. Also, this circuit is unlike voltage controlled delay lines in that the current starved inverters are controlled by a single voltage, Vcont, and the series inverter isn't voltage controlled at all. The single control voltage causes the current starved inverter's delay to degrade/ improve on only one transition to effect a change in the duty cycle.

The number of stages needed depends on the frequency of the CLKIN signal and the desired voltage range at the VCONT terminal. For a fixed number of delay blocks, the voltage range at VCONT required to span from the minimum duty cycle to the maximum one is inversely proportional to the frequency of the signal at CLKIN. Therefore, the number of stages can be designed based on the range of expected input frequencies, the allowed voltage span at VCONT, and the desired duty cycle range of the output signal at CLKOUT.

Figure 7:
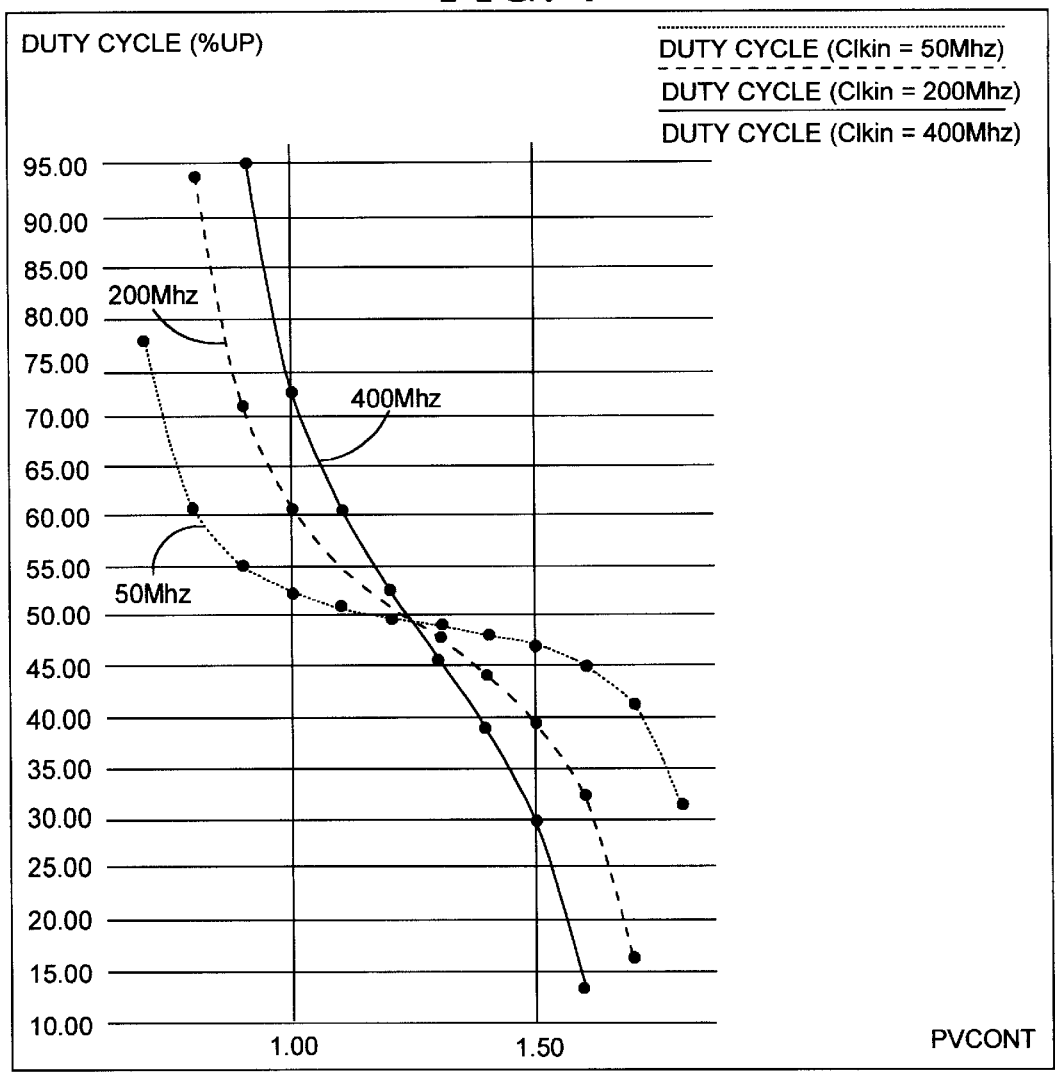
FIG. 7 shows the DUTY CYCLE (%) for a 50 Mhz, 200 Mhz, and a 400 Mhz input clock versus VCONT for a fixed chain length.

FIG. 7 shows the DUTY CYCLE (%) for a 50 Mhz, 200 Mhz, and a 400 Mhz input clock versus VCONT for a fixed chain length.

Examining the 50 MHz curve in FIG. 7 reveals that the duty cycle can be controlled from 78% down to nearly 0% by varying VCONT (the last point on the plot is 32% but by increasing VCONT a lower duty cycle can be achieved). The higher frequency operations for the same number of stages within the VCDCG allow duty cycles to range from nearly 95% down to nearly 0% over a narrower range of VCONT. The shape of the 50 MHz curve relative to the higher frequency curves clearly shows that more precision is available but at the cost of operational duty cycle breadth. Hence, the stage length can be specified for a given frequency to adjust for more precision as well as duty cycle range.

LOW PASS FILTER

As mentioned earlier, the low pass filter LPF shown in FIGS. 4, 8 and 10 is the duty cycle measuring circuit. This filter can be a simple RC circuit whose RC time constant is at least a decade or more away from the operating cycle time of CLKIN. Assuming the filter voltage starts at 0V, the output will increase and will stabilize when the charge being added to the capacitor during the up time of CLKOUT equals the charge being taken away during the down time.

Therefore, if the duty cycle at CLKOUT is exactly 50/50, the filter voltage will be at half the power supply voltage since $$Qup=(C\times(Iup\times R))=Qdown=(C\times(Idown\times R))$$

where $$Iup=(Vdd-(Vdd/2))/R=Idown=Vdd/2R$$

wherein Qup is the charge added to the capacitor to raise its voltage,

Qdown is the charge taken from the capacitor to lower its voltage,

C is the capacitance of the capacitor C,

Iup is the current charging the capacitor,

Idown is the current discharging the capacitor,

R is the resistance of the resistor R, and

Vdd is the voltage supply voltage.

If the duty cycle of CLKOUT is larger than 50/50, the charging time is longer than the discharging one. The equal charge condition is only met when Iup is smaller than Idown. Since the charging and discharging currents are generated by the voltage drop across the resistor, the voltage at the output of the filter has to be greater than VDD/2 and proportional to the duty cycle to compensate for the larger charge time. Therefore, the voltage at the output of the filter is of the same percentage of the power supply voltage as the percentage of the up time in the CLKOUT cycle. As an example, a 60/40 duty cycle at CLKOUT will produce a voltage at the output of the filter equal to 60% of the power supply voltage. Note that the larger the RC time constant, the smaller the ripple in the filter output.

Figure 8:
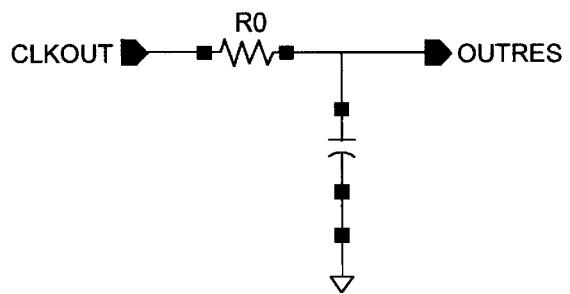
FIG. 8 shows the low pass filter, which can be a simple RC low pass filter or a more complex low pass filter.

FIG. 8 shows the low pass filter, which can be a simple RC low pass filter or a more complex low pass filter.

Figure 9:
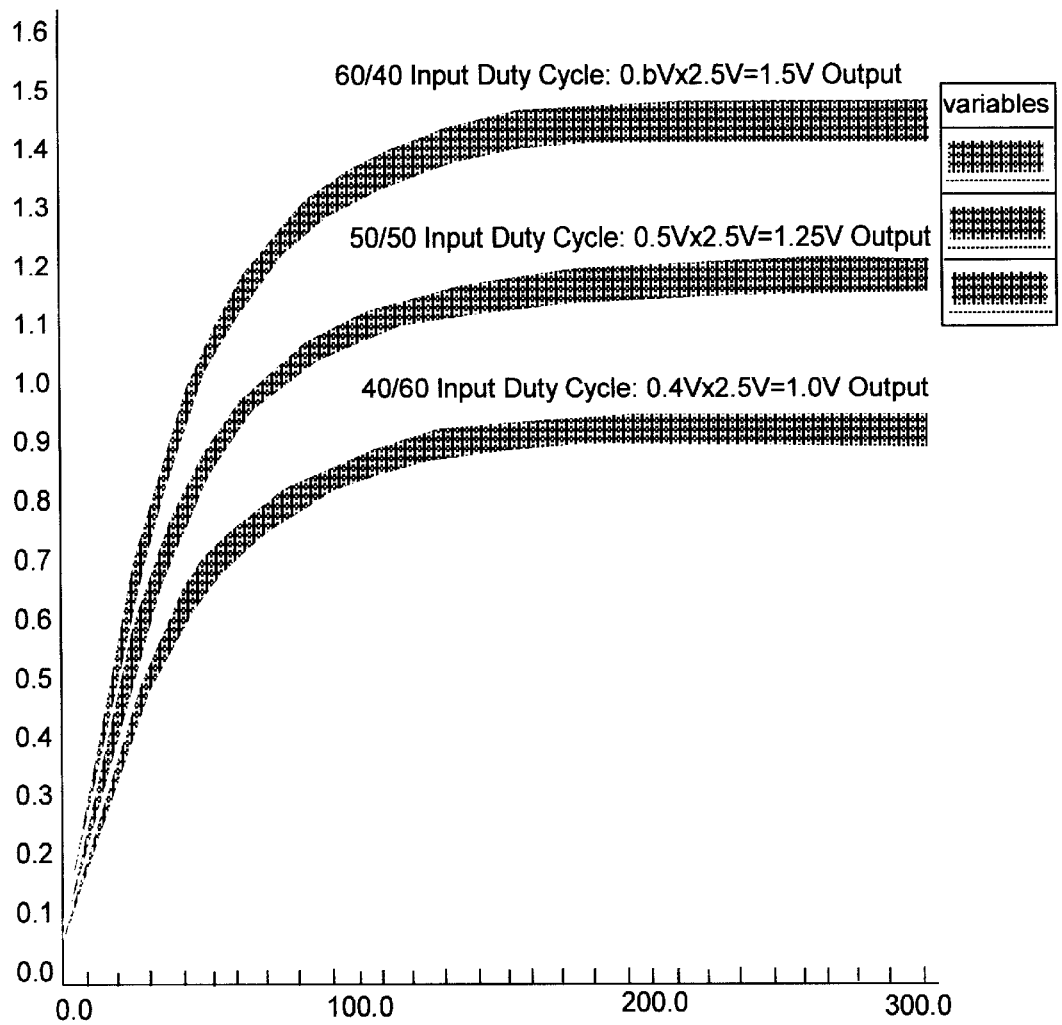
FIG. 9 shows the output of the filter when the CLKOUT signal is at 60/40, 50/50, and 40/60.

FIG. 9 shows the output of the filter when the CLKOUT signal is at 60/40, 50/50, and 40/60 duty cycles. The x axis is time in nanoseconds, the y axis is the output voltage of the filter in volts, which is the duty cycle multiplied by the input voltage of 2.5 volts.

DIFFERENTIAL IMPLEMENTATION OF THE INVENTION

Figure 10:
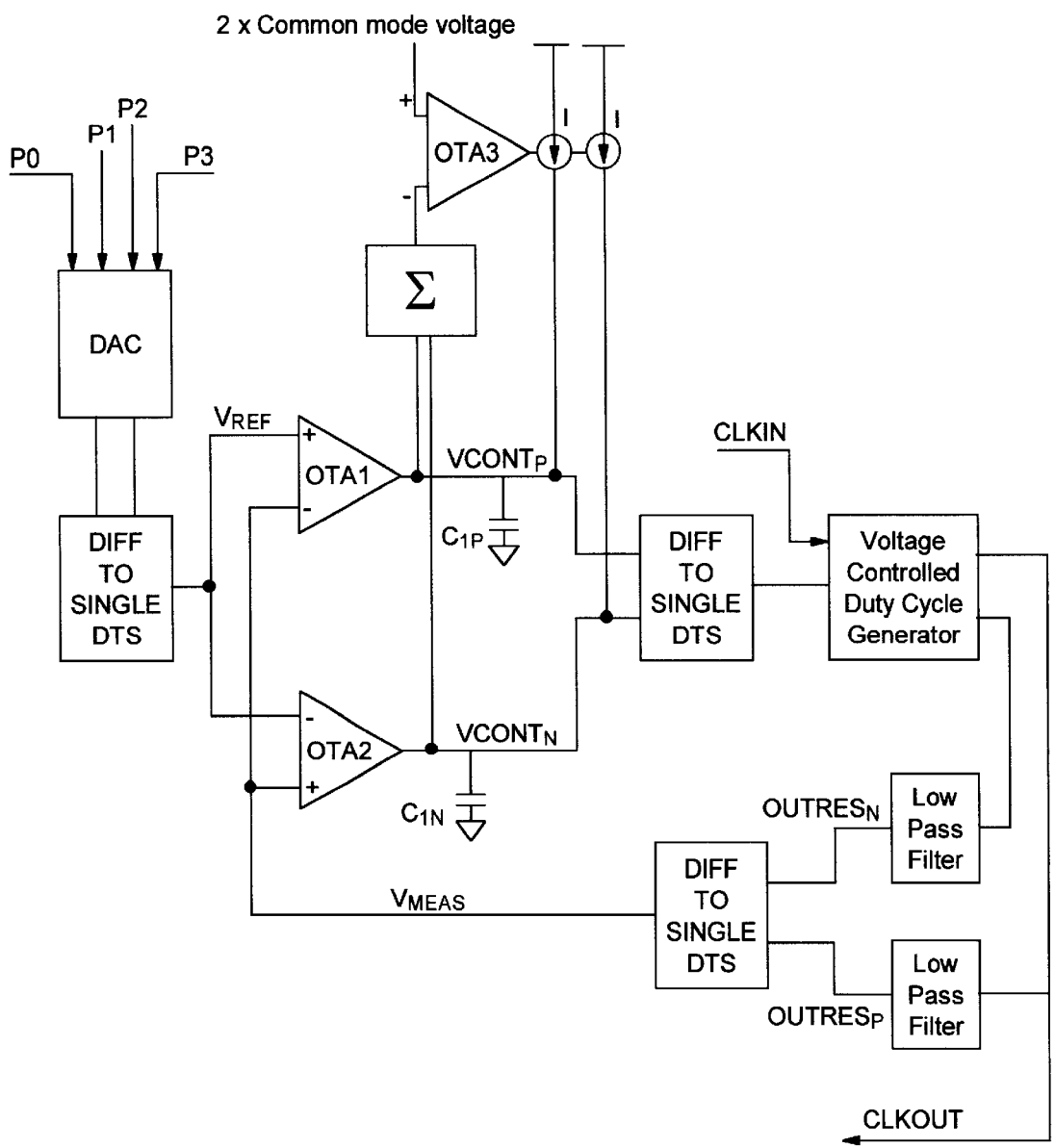
FIG. 10 is a block diagram of the invention using a differential approach which is superior from a noise immunity perspective.

So far, a single ended version of the present invention has been described to ease the description of the invention. FIG. 10 is a block diagram of the invention using a differential approach. Again, this approach is superior from a noise immunity perspective. While this realization is considerably more complex than the single-ended realization, note that the VCDCG is changed only in that it now provides both a true and complement signal to respective LPFs.

Associated with any differential design, a common mode feedback is developed to guarantee maximum voltage compliance. The summing block, OTA3 and the two current sources designated as I, provide that function. This insures that VCONTP and VCONTN are separated equally from a common mode voltage. The summer Σ adds the voltages at VCONTP and VCONTN, and that sum is compared with two times the common mode voltage desired. If the sum is lower than twice the common mode voltage, then current sources I will charge up VCONTP and VCONTN until their sum equals two times the common mode voltage.

The following is a basic description of the blocks of the common mode circuit. The voltage summer Σ, as stated above, adds the VCONTP and VCONTN voltages, and the sum result is compared in OTA3 with twice the common mode voltage desired. It is comprised of two OP AMPS each connected in a voltage to current converter scheme. The OTA3 shown in FIG. 10 is basically the same as the OTA in FIG. 4. The last circuit in FIG. 10 that has not yet been described is the differential to single conversion circuit (DTS). This circuit is another form of an operational transconductance amplifier with a differential cross-coupling to extend the transconductance linear operation region. The same DAC described earlier is used as a differential DAC. Instead of only taking the voltage representing the duty cycle desired, the voltage representing the inverse of the desired duty cycle is selected as the other output. For example, if a duty cycle of 60/40 is desired, the positive output of the DAC is the output that has 0.6 times the supply voltage, and the negative output of the DAC is the output that has 0.4 times the supply voltage. The two voltages then generate a voltage VREF that is proportional to their difference. The same technique used for the differential DAC is also used for the VCDCG. The in-phase signal as well as the out of phase signal go to two RC filters whose outputs go to a differential to single OTA converter.

Now that the individual blocks have been described, the following is an overall description of the differential system. Assuming that C1P and C1N are initially at zero, the common mode circuitry will charge voltages VCONTP and VCONTN to the common mode voltage desired and set by the positive input of OTA3. Since the difference between VCONTP and VCONTN is zero, VMEAS will be lower than the lowest voltage set at VREF. This causes OTA1 to charge VCONTP and OTA2 to discharge VCONTN. This difference in voltage will increase the voltage VMEAS until it is equal to VREF. At that point, the duty cycle out of the VCDCG will be equal to the desired duty cycle.

While several embodiments and variations of the present invention for a precise and programmable duty cycle generator are described in detail herein, it should be apparent that the disclosure and teachings of the present invention will suggest many alternative designs to those skilled in the art.

Having thus described our invention, what we claim as new, and desire to secure by Letters Patent is:

1. A circuit for generating an output clock signal having a desired duty cycle, comprising:

an operational amplifier for comparing an analog voltage representing the desired duty cycle with an analog feedback voltage, and generating an output control signal in response thereto;

a voltage controlled duty cycle generator, responsive to the output control signal of the operational amplifier and having an input clock signal, for generating an output clock signal having the desired duty cycle;

a low pass filter, responsive to the output clock signal, for measuring the duty cycle of the output clock signal and for generating the analog feedback voltage for the operational amplifier, thereby providing a closed loop operation.

2. The circuit of claim 1, including an n-bit digital to analog converter for converting a digitally encoded desired duty cycle into the analog voltage.

3. The circuit of claim 2, including a register for storing a set of register bits representative of the digitally encoded desired duty cycle and providing an input to the digital to analog converter.

4. The circuit of claim 1, wherein the operational amplifier comprises an operational transconductance amplifier for generating an output current proportional to a difference of its input voltages; and a capacitor for receiving the generated output current for charging or discharging the capacitor to produce a voltage across the capacitor which controls the voltage controlled duty cycle generator.

5. The circuit of claim 1, wherein the output of the digital to analog converter is applied to a noninverting input of the operational amplifier, and the output of the low pass filter is applied to an inverting input of the operational amplifier, such that the voltage controlled duty cycle generator inverts the clock signal to produce the output clock signal.

6. The circuit of claim 1, wherein the output of the digital to analog converter is applied to an inverting input of the operational amplifier, and the output of the low pass filter is applied to a noninverting input of the operational amplifier, such that the voltage controlled duty cycle generator does not invert the input clock signal to produce the output clock signal.

7. The circuit of claim 1, in a differential implementation which provides higher noise immunity, wherein the voltage controlled duty cycle generator provides both a true and complement signal to respective first and second low pass filters.

8. The circuit of claim 7, further including a summing circuit, and first and second current sources, wherein the summing circuit adds first and second output control voltages to develop a sum voltage, and the operational amplifier compares the sum voltage with two times a common mode desired voltage, and if the sum voltage is lower than two times the common mode voltage, then the current sources increase the first and second output control voltages until their sum equals two times the common mode voltage.

9. The circuit of claim 1, wherein the voltage controlled duty cycle generator comprises a plurality of stages, each of which comprises a current starved inverter followed by an inverter.

10. The circuit of claim 9, wherein the plurality of stages is followed by an inverter.

11. The circuit of claim 9, wherein each stage is comprised of PFET current sources and NFET current sources followed by a series inverter which presents a capacitive load to the current sources, to provide either additive or subtractive duty cycle corrections, the plurality of current starved inverters being controlled by the output control signal voltage of the operational amplifier which is connected to both the PFET current sources and the NFET current sources, and as the output control voltage increases, the PFET current sources provide a smaller current to charge the capacitive load, and the NFET current sources provide a larger current to discharge the capacitive load, such that the output waveform has a slow rising edge and a fast falling edge, and the difference in edge rates causes the output of the inverter to have a longer falling delay than a rising delay to produce a duty cycle that is controlled by the output control signal voltage of the operational amplifier.

12. The circuit of claim 11, wherein the plurality of stages is followed by an inverter.

13. The circuit of claim 1, wherein the low pass filter comprises an RC low pass filter.

14. The circuit of claim 13, wherein the low pass filter is an RC circuit whose RC time constant is at least a decade or more away from the operating cycle time of the input clock signal.

15. A voltage controlled duty cycle generator comprising a plurality of stages, each of which comprises a current starved inverter comprised of PFET current sources and NFET current sources followed by a series inverter which presents a capacitive load to the current sources, to provide either additive or subtractive duty cycle corrections, the plurality of current starved inverters being controlled by a single input control signal voltage, said single input control signal voltage being connected to both the PFET current sources and the NFET current sources, and as the input control voltage increases, the PFET current sources provide a smaller current to charge the capacitive load, and the NFET current sources provide a larger current to discharge the capacitive load, such that the output waveform has a slow rising edge and a fast falling edge, and the difference in edge rates causes the output of the inverter to have a longer falling delay than a rising delay to produce a duty cycle that is controlled by the single input control signal voltage.

16. The circuit of claim 15, wherein the plurality of stages is followed by an inverter.

* * * * *